(12) United States Patent
Gao et al.

(10) Patent No.: US 9,954,533 B2
(45) Date of Patent: Apr. 24, 2018

(54) DRAM-BASED RECONFIGURABLE LOGIC

(71) Applicants: Mingyu Gao, Stanford, CA (US); Hongzhong Zheng, Sunnyvale, CA (US); Krishna T. Malladi, San Jose, CA (US)

(72) Inventors: Mingyu Gao, Stanford, CA (US); Hongzhong Zheng, Sunnyvale, CA (US); Krishna T. Malladi, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/814,503

(22) Filed: Jul. 30, 2015

(65) Prior Publication Data
US 2016/0173102 A1 Jun. 16, 2016

Related U.S. Application Data

(60) Provisional application No. 62/092,819, filed on Dec. 16, 2014, provisional application No. 62/092,822, (Continued)

(51) Int. Cl.
*H03K 19/177* (2006.01)
*H01L 25/18* (2006.01)
*H01L 25/00* (2006.01)

(52) U.S. Cl.
CPC ......... *H03K 19/1776* (2013.01); *H01L 25/18* (2013.01); *H01L 25/50* (2013.01); (Continued)

(58) Field of Classification Search
CPC ......... H03K 19/17704; H03K 19/1776; H03K 19/17728; H03K 19/17748; G06F 15/7867; G06F 17/5054
(Continued)

(56) References Cited

U.S. PATENT DOCUMENTS 5,689,195 A * 11/1997 Cliff .................. H03K 19/1736
326/39
5,926,036 A * 7/1999 Cliff .......................... G11C 8/12
326/39
(Continued)

OTHER PUBLICATIONS

Tau, et. al. "A First Generation DPGA Implementation", FPD'95 Third Canadian Workshop of Field-Programmable Devices, May 29-Jun. 1, 1995.*
(Continued)

*Primary Examiner* — Alexander H Taningco
*Assistant Examiner* — Seokjin Kim
(74) *Attorney, Agent, or Firm* — Renaissance IP Law Group LLP

(57) ABSTRACT

According to one general aspect, an apparatus may include a memory array comprising a plurality of memory sub-arrays. At least one of the sub-arrays may be arranged as a reconfigurable look-up table. The reconfigurable look-up table may include: a plurality of memory cells configured to store data, a local row decoder configured to activate one or more rows of memory cells based upon a set of input signals, a local line selector configured to select a sub-set of the row of memory cells based upon at least one input signal.

19 Claims, 6 Drawing Sheets

Related U.S. Application Data filed on Dec. 16, 2014, provisional application No. 62/092,825, filed on Dec. 16, 2014.

(52) U.S. Cl.
CPC . *H03K 19/17728* (2013.01); *H03K 19/17736* (2013.01); *H01L 2924/0002* (2013.01)

(58) Field of Classification Search
USPC ........ 326/37–50; 716/16, 17, 116, 117, 128, 716/138
See application file for complete search history.

(56) References Cited

U.S. PATENT DOCUMENTS

| | | | | |
|---|---|---|---|---|
| 6,020,759 | A * | 2/2000 | Heile | H03K 19/1776 326/37 |
| 6,172,521 | B1 * | 1/2001 | Motomura | H03K 19/17728 326/40 |
| 6,304,101 | B1 * | 10/2001 | Nishihara | G06F 17/5054 326/40 |
| 6,449,692 | B1 | 9/2002 | Krueger et al. | |
| 7,675,949 | B2 | 3/2010 | Bartley et al. | |
| 2008/0117710 | A1 * | 5/2008 | Kajigaya | G11C 7/1006 365/230.06 |
| 2008/0162856 | A1 | 7/2008 | Chai et al. | |
| 2010/0306297 | A1 * | 12/2010 | Clemow | H03H 17/04 708/300 |
| 2014/0244981 | A1 * | 8/2014 | Okada | G06F 15/7867 712/220 |

OTHER PUBLICATIONS

Motomura, M., Aimoto, Y., Shibayama, A., Yabe, Y., & Yamashina, M. (Apr. 1998). An embedded DRAM-FPGA chip with instantaneous logic reconfiguration. In FPGAs for Custom Computing Machines, 1998. Proceedings. IEEE Symposium on (pp. 264-266). IEEE.*

Tau, et al. "A First Generation DPGA Implementation", FPD'95 Third Canadian Workshop of Field-Programmable Devices, May 29-Jun. 1, 1995.*

* cited by examiner

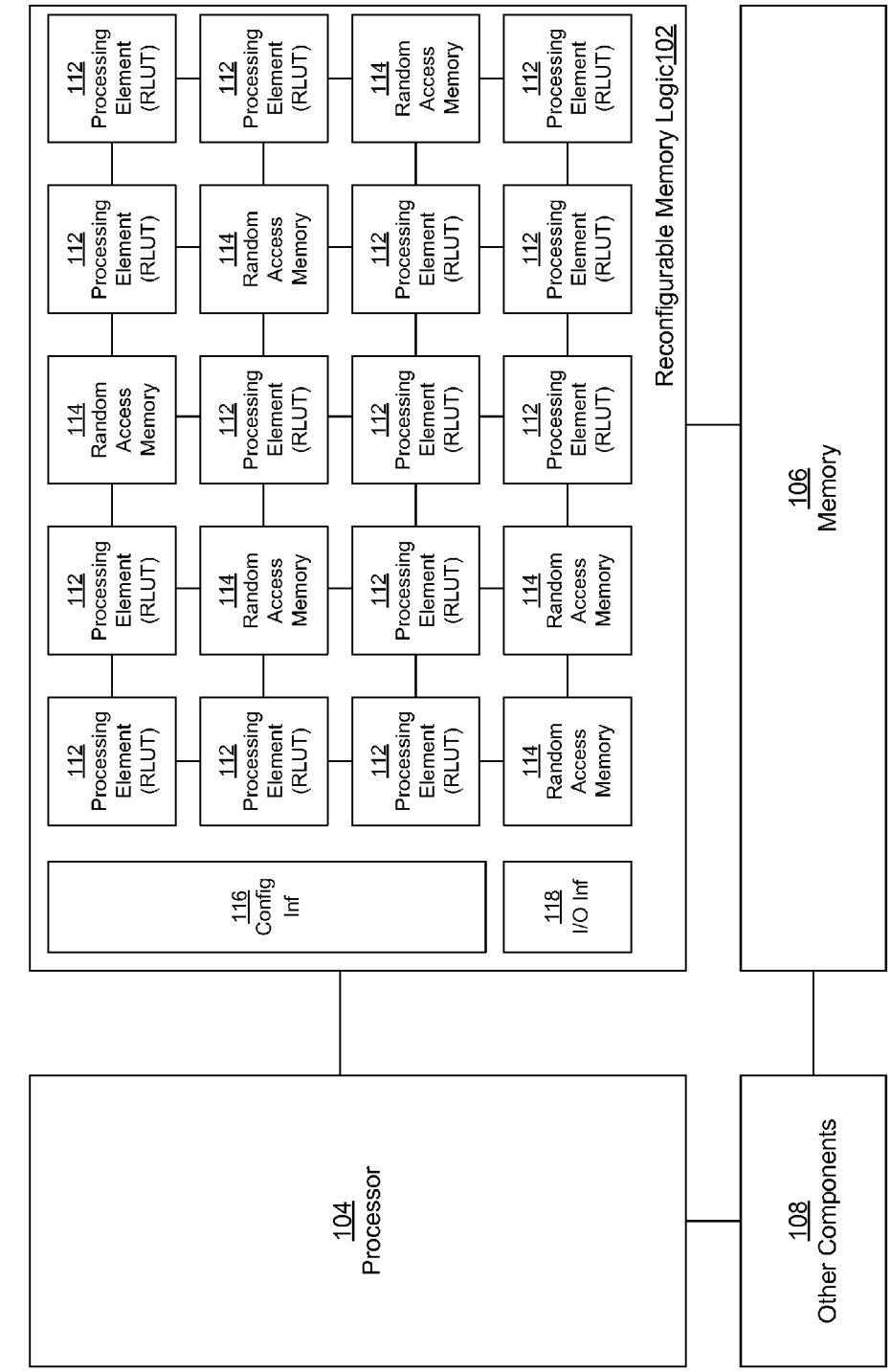

200

250

270

300

2

DRAM-BASED RECONFIGURABLE LOGIC

CROSS-REFERENCE TO RELATED APPLICATION

This application claims priority under 35 U.S.C. § 119 to Provisional Patent Application Ser. No. 62/092,819, entitled "DRAM-BASED RECONFIGURABLE LOGIC" filed on Dec. 16, 2014. The subject matter of this earlier filed application is hereby incorporated by reference.

This application claims priority under 35 U.S.C. § 119 to Provisional Patent Application Ser. No. 62/092,822, entitled "HBM WITH DRAM-BASED RECONFIGURABLE LOGIC ARCHITECTURE" filed on Dec. 16, 2014. The subject matter of this earlier filed application is hereby incorporated by reference.

This application claims priority under 35 U.S.C. § 119 to Provisional Patent Application Ser. No. 62/092,825, entitled "SPACE-MULTIPLEXING DRAM-BASED RECONFIGURABLE LOGIC" filed on Dec. 16, 2014. The subject matter of this earlier filed application is hereby incorporated by reference.

TECHNICAL FIELD

This description relates to computing technology, and more specifically to reconfigurable processing units.

BACKGROUND

Generally, a programmable logic device (PLD) is an electronic component used to build reconfigurable digital circuits. Unlike a logic gate or logic circuit, which generally has a fixed function, a PLD traditionally has an undefined function at the time of manufacture. Often, before the PLD can be used in a circuit it must be programmed, that is, reconfigured to perform a desired function.

Traditionally a PLD may include a combination of a logic device and a memory device. Generally, the memory is used to store a pattern that was given to the chip during programming. Most of the methods for storing data in an integrated circuit have been adapted for use in PLDs. These generally include silicon anti-fuses, static random access memory (SRAM), erasable programmable read only memory (EPROM), electronically EPROM (EEPROM), non-volatile RAM, etc. In general, most PLDs include components that are programmed by applying an unusual level of voltage across a modified area of silicon inside the chip. This high level of voltage breaks or sets (depending on the technology) electrical connections and changes the layout of the electrical circuit.

One of the most common types of PLDs is a field-programmable gate array (FPGA). A FPGA is an integrated circuit designed to be configured by a customer or a designer after manufacturing—hence "field-programmable". The FPGA configuration is generally specified using a hardware description language (HDL), similar to that used for an application-specific integrated circuit (ASIC).

FPGAs include an array of programmable logic blocks, and a hierarchy of reconfigurable interconnects that allow the blocks to be "wired together". A FPGA's logic blocks can be configured to perform complex combinational functions, or merely simple logic gates like AND, XOR, etc.

SUMMARY

According to one general aspect, an apparatus may include a memory array comprising a plurality of memory sub-arrays. At least one of the sub-arrays may be arranged as a reconfigurable look-up table. The reconfigurable look-up table may include: a plurality of memory cells configured to store data, a local row decoder configured to activate one or more rows of memory cells based upon a set of input signals, a local line selector configured to select a sub-set of the row of memory cells based upon at least one input signal.

According to another general aspect, an apparatus may include a processor comprising fixed logical circuit configured to execute logical functions. The processor may be configured to: store data in a memory cell of a dynamic random access memory array, store a look-up table configured to perform a logical function in a reconfigurable look-up table of the dynamic random access memory array, and offload an execution of a logical function to a reconfigurable look-up table included by a dynamic random access memory array.

According to another general aspect, a method may include writing, via a first memory access by a processor, a first look-up table to a sub-array of a reconfigurable look-up table of a dynamic random access memory array. The method may also include performing, by the reconfigurable look-up table and in response to a second memory access by a processor, a first logic operation. The method may include writing, via a third memory access by a processor, a second look-up table to a sub-array of a reconfigurable look-up table of a dynamic random access memory array. The method may further include performing, by the reconfigurable look-up table and in response to a fourth memory access by a processor, a second logic operation.

The details of one or more implementations are set forth in the accompanying drawings and the description below. Other features will be apparent from the description and drawings, and from the claims.

A system and/or method for computing technology, and more specifically to reconfigurable processing units, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

Like reference symbols in the various drawings indicate like elements.

DETAILED DESCRIPTION

Figure 2A:
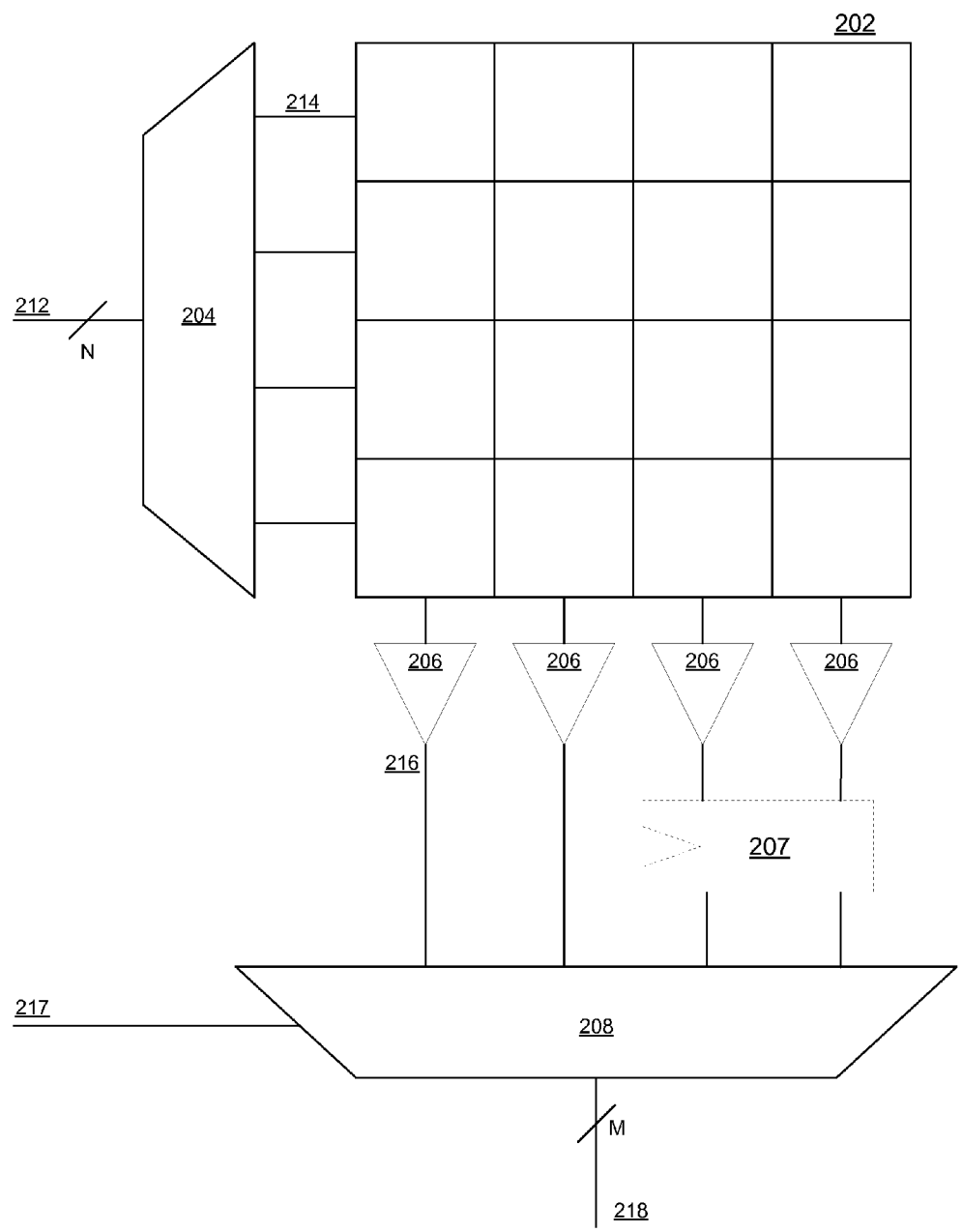
FIG. 2a is a block diagram of an example embodiment of an apparatus in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a processor 104, a memory 106, and a reconfigurable memory logic 102. In various embodiments, the system 108 may also include one or more other components 108 (e.g., a network interface, a memory controller, etc.).

In various embodiments, the system 100 may include a system on a chip (SoC). In another embodiment, the system 100 may include a series of discrete or individual components. In yet another embodiment, the system 100 may include a combination of integrated and discrete components. In various embodiments, the system 100 may include a computing device, such as, for example, a laptop, desktop, workstation, personal digital assistant, smartphone, tablet, and other appropriate computers, etc. or a virtual machine or virtual computing device thereof. In various embodiments, the system 100 may be used by a user (not shown).

In the illustrated embodiment, the processor 104 may be configured to execute one or more machine executable instructions or pieces of software, firmware, or a combination thereof. In such an embodiment, the processor 104 may include fixed logic circuits (e.g., AND gates, flip-flops, etc.) that are set during the manufacture of the processor 104 (or shortly thereafter, e.g., fuses, etc.) and may not be substantially changed after manufacture.

In various embodiments, the memory 106 may include a plurality of memory cells each configured to store one or more pieces of data, either temporarily, permanently, semi-permanently, or a combination thereof. The data in the memory 106 may be accessed by the processor 104. Further, the memory 106 may include volatile memory, non-volatile memory or a combination thereof.

In the illustrated embodiment, the system 100 may include a reconfigurable memory logic 102. The reconfigurable memory logic 102 may be similar to the memory 106 in that they may both include a number of memory cells (not explicitly shown) that are arranged in sub-arrays (illustrated as elements 112 and 114). Typically, a memory (e.g., an SRAM, a dynamic RAM (DRAM), etc.) includes an array of memory cells arranged into an array of rows and columns. Often, in order to make the larger array more manageable, the array may be divided into sub-arrays of memory cells (e.g., 256 rows by 256 columns, etc.). Traditionally, division of a memory array into sub-arrays may be advantageous because generally only one sub-array is accessed at a time, thus reducing power and computation complexity.

In the illustrated embodiment, the memory array (illustrated by the reconfigurable memory logic 102) may differ from the memory 106 in that the sub-arrays may be reconfigured to act as look-up tables (LUTs) instead of traditional memory sub-arrays. In such an embodiment, a logic function may be implemented in a LUT. For example, the LUT may perform an arithmetic logic function, such as that of an adder, multiplier, etc. It is understood that the above is merely one illustrative example to which the disclosed subject matter is not limited. In the illustrated embodiment, such LUTs may be referred to as processing elements or reconfigurable LUTs (RLUTs) 112.

In such an embodiment, a RLUT 112 and the logic function implemented therein may be altered by merely performing a memory write operation. This may allow logic functions to be reconfigured or altered dynamically during the operation of the system 100. The use of a traditional write operation (or similar) may allow for reprogramming without the need of an unusual (i.e., non-operational or high) voltage, such as those used for programming EEPROMs, etc.

In such an embodiment, the reconfigurable memory logic 102 may include a configuration interface 116. In various embodiments, when the processor 104 (or other component) wishes to change or alter the logic function stored in the RLUT 112, it may perform a write operation or a special write operation (e.g., a write operation that includes an indicator that it involves a RLUT 112, etc.).

In some embodiments, all memory accesses or operations may pass through the reconfigurable memory logic 102's input/output (I/O) interface 118. In such an embodiment, if the memory access is to a sub-array that stores data for revival (e.g., a RAM sub-array 114, etc.), the I/O interface 118 may simply process the read/write request as a memory array traditionally would. However, in some embodiments, if the memory access is to a sub-array that is employed as a RLUT 112 (or will be employed as a RLUT 112), the I/O interface 118 may pass that memory access to the configuration interface 116 for processing.

In yet another embodiment, the I/O interface 118 may be configured to read or write to the RLUT 112. In such an embodiment, the write access may involve writing to the RLUT 112 to define the logical function thereof. In such an embodiment, the configuration interface 116 may be configured to adjust the routing of signals within the RLUT 112 or the reconfigurable memory logic 102 as a whole. For example, the configuration interface 116 may be configured to adjust the routing of signals between multiple RLUT 112 and/or the RAM 114s. In such an embodiment, the I/O interface 118 may be configured to manage data access to the RLUT 112s and RAMs 114, and the configuration interface 116 may be configured to manage the interconnects and routing of the sub-arrays 112 & 114. It is understood that the above are merely a few illustrative examples to which the disclosed subject matter is not limited. In various embodiments, the I/O interface 118 may include the configuration interface 116.

Further, in the illustrated embodiment, each sub-array may be utilized as either a RLUT 112 or as a traditional RAM 114 memory sub-array. As described above, a traditional RAM 114 sub-array may be configured to store data and information. In such an embodiment, the number of or balance between RLUTs 112 and RAM subarrays 114 may be dynamically adjusted within the reconfigurable memory logic 102 as desired. In another embodiment, the number of RLUTs 112 and RAM sub-arrays 114 may be fixed during manufacture. In yet another embodiment, a maximum number of RLUTs 112 may be fixed during manufacture but the RLUTs 112 may be configurable to operate as RAM sub-arrays 114. It is understood that the above are merely a few illustrative examples to which the disclosed subject matter is not limited.

In various embodiments, the processor 104 (or other component) may wish to configure a sub-array as a RLUT 112. In such an embodiment, the processor 104 may make a memory access to the reconfigurable memory logic 102. The memory access may include a write operation that stores a look-up table in a particular RLUT 112. The memory access may include a series of memory accesses depending upon the size of the LUT. In some embodiments, particular memory accesses may indicate the number of inputs to the LUT and the number of outputs from the LUT. In addition, further memory accesses may indicate signal routing information regarding the RLUT 112. For example, as described below, multiple RLUTs 112 may be cascaded or otherwise routed together to perform logical functions (e.g., an adder, etc.).

Conversely, the processor 104 (or other component) may wish to configure a sub-array as a RAM 114. In which case, the memory accesses may instruct the configuration interface 116 to re-configure the RLUT 112 back to a standard RAM 114. In some embodiments, a predefined memory cell may be configured to store a bit that indicates whether or not the sub-array is currently functioning as a RLUT 112 or a RAM 114. In various embodiments, that indication bit may be included in the sub-array or the configuration interface 116. It is understood that the above are merely a few illustrative examples to which the disclosed subject matter is not limited.

In various embodiments, the reconfigurable memory logic 102 may include dynamic RAM (DRAM). This may differ from the traditional FPGA or PLD technology in that the RLUTs 112 may be reprogrammed by normal memory access operations and without the need to resort to special voltages (e.g., to burn fuses, or set transistors, etc.).

In such an embodiment, by basing the RLUTs 112 on DRAM subarrays a higher density may be achieved, compared to an SRAM-based FPGA. For example, the DRAM RLUT 112 may require only one transistor and one capacitor (1T1C) per memory cell or bit of information, compared to the SRAM's need for six transistors (6T). In another embodiment, the DRAM RLUT 112s may result in a lower cost compared to SRAM or Flash-based FPGAs.

As the RLUT 112 may be modified by a traditional memory access (or a variant thereof), the RLUT 112 may be self-modifying. For example, the outputs of one clock-cycle's RLUT 112 computation may result in a memory access that re-configures or updates the RLUT 112 to perform a second computational function. In another embodiment, the outputs of a RLUT 112 may be feedback as inputs to the same RLUT 112 in a way that modifies the RLUT 112's behavior.

In addition, in various embodiments, the co-mingling of the DRAM RLUTs 112 and RAMs 114 may provide advantages. For example, the close proximity to the data stored in the RAM 114, may speed the computation performed by the RLUT 112, and lower the power requirements as data need not be moved across busses. In some embodiments, by basing the RLUT 112 upon DRAM-technology similar to that used to create the processor 104 and memory 106, the RLUT 112s may exist within the same die or package as the processor 104 and/or memory 106. As such, the near-data computing provided by the DRAM RLUT 112s may be faster and more efficient. In addition, the same manufacturing process may lower the cost of the production of system 100. It is understood that the above are merely a few illustrative examples to which the disclosed subject matter is not limited.

FIG. 2a is a block diagram of an example embodiment of an apparatus or RLUT 200 in accordance with the disclosed subject matter. In the illustrated embodiment, the RLUT 200 may include a sub-array or plurality of memory cells 202 configured to store data. In the illustrated embodiment, the memory cells 202 may store a look-up table that performs a logic function (e.g., a 4-bit adder, etc.).

In various embodiments, the RLUT 200 may receive N signals as inputs 212. In various embodiments, the N input signals 212 may be divided into groups based upon operands of the RLUT 200's logic function. For example, if the input signals 212 include 8-bits, they may be grouped into two 4-bit operands. It is understood that the above is merely one illustrative example to which the disclosed subject matter is not limited.

The inputs 212 may be decoded by a local row decoder 204. In various embodiments, the local row decoder 204 may be configured to activate one or more rows 214 of memory cells 202 based upon the values of the input signals 212. In various embodiments, the local row decoder 204 may use the input signals' 212 values as an address to a row of the memory cells 202.

In the illustrated embodiment, each column of the memory cells 202 may be coupled with a driver 206 configured to output, at a predefined voltage, the values stored in the selected row. In various embodiments, the driver 206 may include a word line driver.

In some embodiments, the RLUT 200 may include one or more registers 207 configured to store output signals of the RLUT 200. For example, in some embodiments, the RLUT 200 may be part of a pipelined architecture in which inputs and/or outputs are generally expected to be stable between the edges of a clock signal. In such an embodiment, the registers 207 may be employed to stabilize or hold the output signal 218 values as required by the pipeline architecture. In the illustrated embodiment, the register 207 is shown between the driver 206 and the local line selector 208. In another embodiment, the register 207 may be placed after the local line selector 208. It is understood that the above is merely one illustrative example to which the disclosed subject matter is not limited.

In some embodiments, the RLUT 200 may include a local line selector 208 configured to select a sub-set 216 of the row of memory cells 202 based upon at least one input signal 217. In such an embodiment, the local line selector 208 may generate the final output signal 218. In the illustrated embodiment, the output signal 218 may include M-bits.

In some embodiments, the value of the input signal 217 may dynamically change. For example in the case of an adder the input signal 217 may function as a carry-in bit, and change with each new addition operation. In another embodiment, the input signal 217 may be a relatively consistent value. For example, the RLUT 200 may have word lines of 16 bits, but the desired output signals 218 may only include 5 bits. In such an embodiment, the input signal 217 may be configured to select only the first 5-bits of the 16-bit word. It is understood that the above are merely a few illustrative examples to which the disclosed subject matter is not limited.

In various embodiments, it may be advantageous for the DRAM-based RLUT 200 to be limited to a minimum number of inputs 212 and a minimum number of outputs 218. For example, if the memory cells 202 include an entire sub-array, the number of rows and columns may be relatively large. As such, it may be more efficient to employ a LUT that makes use of most of the sub-array's rows (e.g., input signals 212) and most of the sub-array's columns (e.g., output signals 218). In such an embodiment, a predefined minimum number of inputs/outputs may result in a minimum amount of efficient utilization of the sub-array.

In various embodiments, the utilization of the sub-array may lend the RLUT 200 to arithmetic computing functions (e.g., an adder, etc.) that include a relatively large number of inputs/outputs. Conversely, while the RLUT 200 may be employed for computing functions with a small number of inputs/outputs (e.g., random control logic, etc.) this may not be the most efficient use of the RLUT 200. It is understood that the above is merely one illustrative example to which the disclosed subject matter is not limited.

In one example embodiment, the RLUT 200 may be configured to include a minimum operand width of 4-bits. In such an embodiment, a two operand logic function may include a total input signal 212 width of 8-bits. Likewise, the RLUT 200 may be configured to include a minimum output signal 218 width of 9-bits. In another embodiment, the RLUT 200 may be configured to include a minimum output signal 218 width equal to two times the minimum operand width (e.g., 8-bits, etc.). It is understood that the above is merely one illustrative example to which the disclosed subject matter is not limited.

In various embodiments, the RLUT 200 may be configured such that the number of input signals 212 and/or output signals 218 may be dynamically altered. For example, as the logic function performed by the RLUT 200 is dynamically altered from a first function to a second function, the number of input signals 212, number of operands, and/or number of output signals 218 may also be dynamically altered. In such an embodiment, this alteration may involve selecting a subset of the total possible number of signals 212 and/or 218 as active.

Figure 2B:
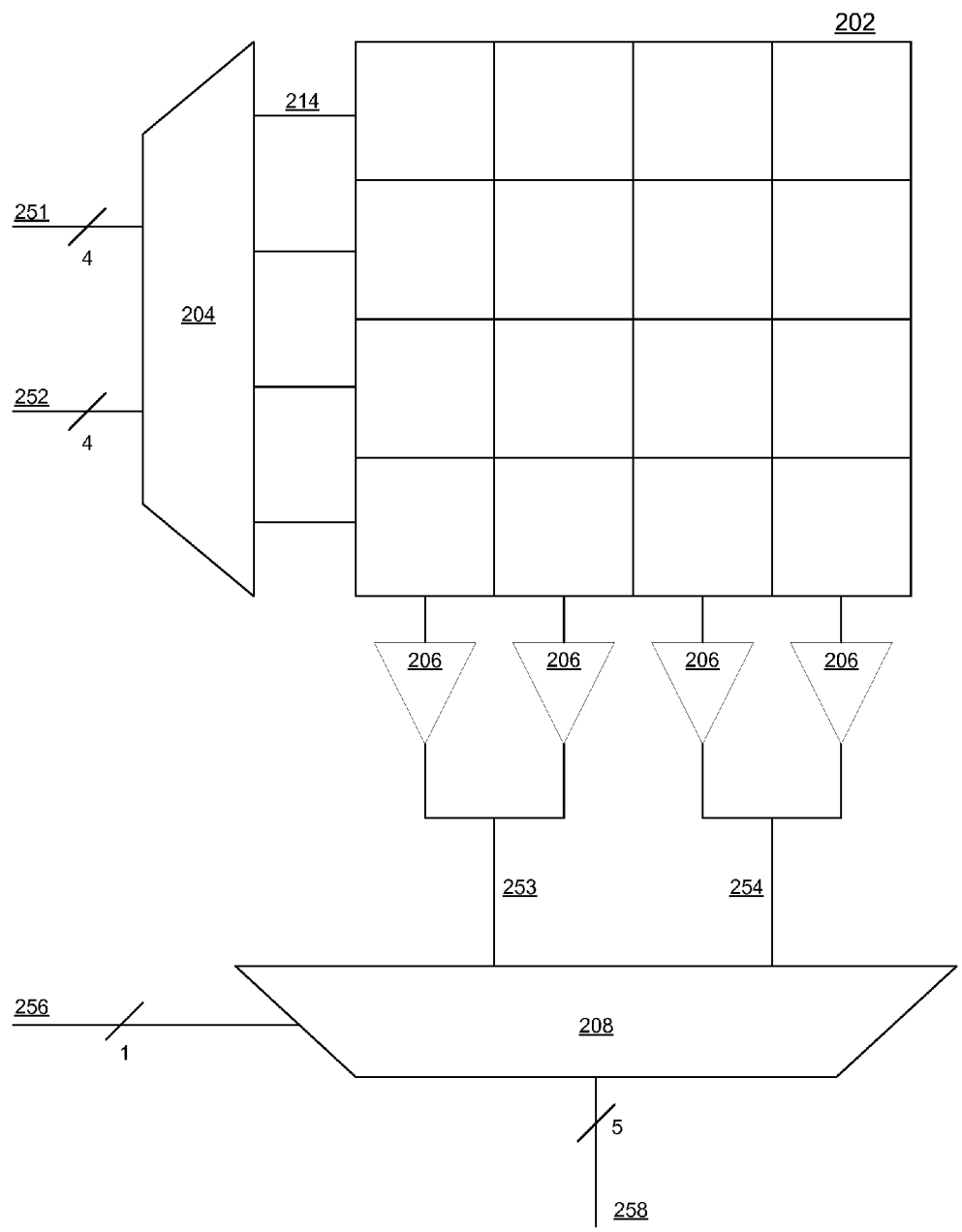
FIG. 2b is a block diagram of an example embodiment of an apparatus in accordance with the disclosed subject matter.

FIG. 2b is a block diagram of an example embodiment of an apparatus or RLUT 250 in accordance with the disclosed subject matter. In the illustrated embodiment, a simple 4-bit adder with a carry-in is shown. In various embodiments, this may be implemented via an 8-to-10 LUT with a minimum operand width of 4. It is understood that the above is merely one illustrative example to which the disclosed subject matter is not limited.

As described above, the RLUT 250 may include a plurality of memory cells 202, a local row decoder 204, a local line selector 208, and a series of drivers 206. In the illustrated embodiment, the RLUT 250 may receive two operands 251 and 252. The first operand (A) 251 may include 4-bits. Likewise the second operand (B) 252 may include 4-bits. The memory cells 202 may include or store a look-up table that serves as an adder, essentially adding the two operands together to form the output candidates 253 and 254.

As described above, the local row decoder may use the input signals or operands 251 and 252 as address bits to activate a selected row 214. In the illustrated embodiment, the row may produce two potential output values 253 and 254. These values may be equal to, in the first case 253, A+B, and, in the second case 254, A+B+1. In various embodiments, the look-up table may increase the efficiency of the table by storing a plurality of candidate values in each row.

The RLUT 250 may receive a third operand or input signal 256. In the illustrated embodiment, the third operand 256 may function as a carry-in bit. In the illustrated embodiment, the carry-in bit may cause the local line selector 208 to select between the first output candidate 253 (A+B) and the second output candidate 254 (A+B+1). The selected output candidate may become the 5-bit output signals 258. In various embodiments, the 5-bit output signal 258 may include a 4-bit sum and a 1-bit carry-out.

As described above, it is understood that the illustrated is merely one illustrative example to which the disclosed subject matter is not limited. In various embodiments, other arithmetic functions (e.g., multiplication, cryptographic conversion, matrix manipulation, etc.) may be implemented via a RLUT. In another embodiment, non-arithmetic functions (e.g., key/value pairs, dictionaries, etc.) may be implemented via a RLUT. It is understood that the above are merely a few illustrative examples to which the disclosed subject matter is not limited.

Figure 2C:
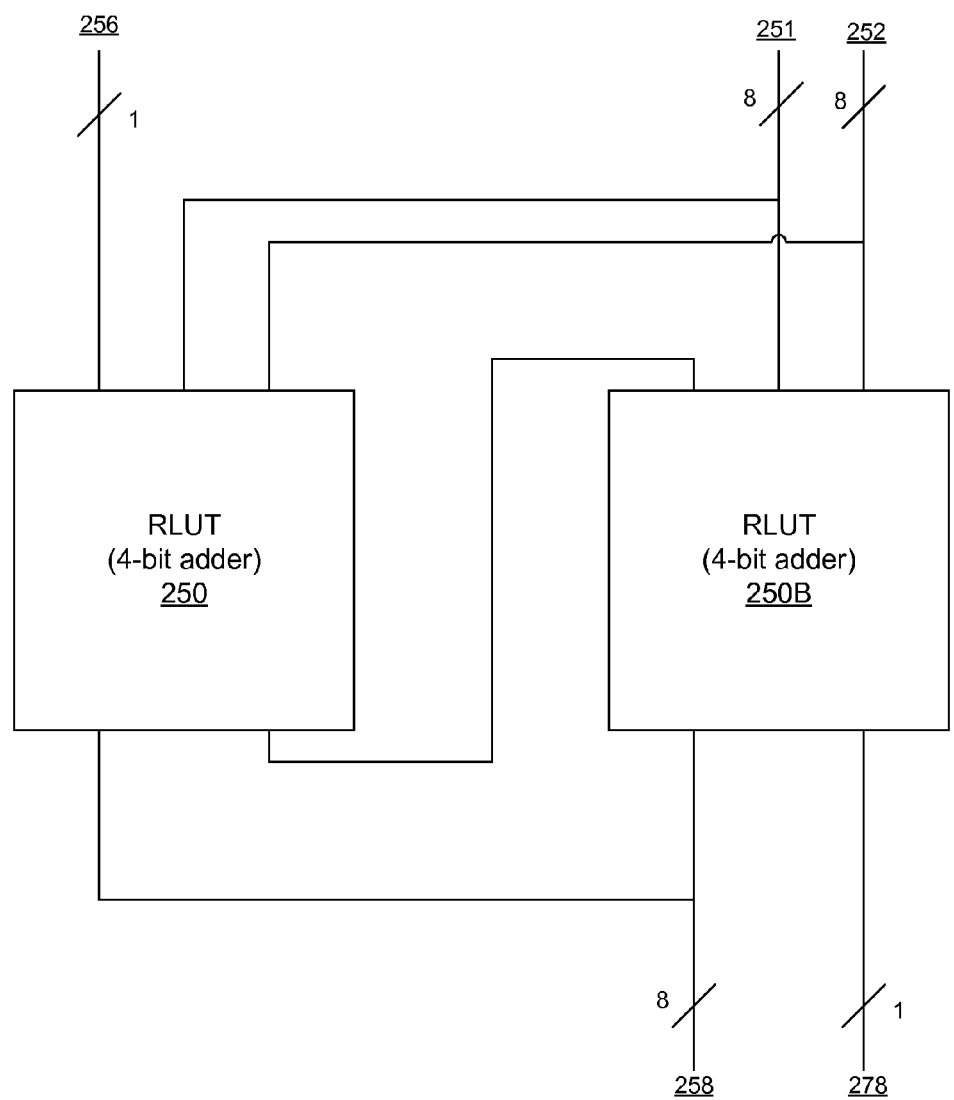
FIG. 2c is a block diagram of an example embodiment of an apparatus in accordance with the disclosed subject matter.

FIG. 2c is a block diagram of an example embodiment of an apparatus 270 in accordance with the disclosed subject matter. In the illustrated embodiment, an 8-bit adder with a carry-in is shown. In various embodiments, this may be implemented via cascading or routing signals between two RLUTs 250 & 250B, where each RLUT is configured as a 4-bit adder. It is understood that the above is merely one illustrative example to which the disclosed subject matter is not limited.

In the illustrated embodiment, two RLUTs 250 and 250B may be coupled in such a way as to perform more complex tasks together than they could individually. In another embodiment, a larger number of RLUTs may be so routed or coupled to perform other tasks or functions. Further, in various embodiments, the coupled RLUTs need not be homogeneous, but may include a variety of RLUTs programmed to perform various tasks or functions. Also, the RLUTs may be configured to form a processing pipeline. It is understood that the above is merely one illustrative example to which the disclosed subject matter is not limited.

In the illustrated embodiment, the inputs to the apparatus 270 may include two 8-bit operands 251 and 252, and a 1-bit carry-in bit 256. The apparatus 270 may include two RLUTs 250 and 250B, each configured as 4-bit adders, as shown in FIG. 2b.

The first RLUT 250 may be configured to process the 4 least significant bits (LSBs) of the 8-bit operands 251 and 252, and the carry-in bit 256. The second RLUT 250B may be configured to process the 4 most significant bits (MSBs) of the 8-bit operands 251 and 252, and the carry-out bit of the first RLUT 250. The outputs of the RLUTs 250 and 250B may be concatenated to form the 8-bit output or sum 258. The carry-out bit of the second RLUT 250B may be used as the carry-out bit 278 for the apparatus 250, as a whole.

Figure 3:
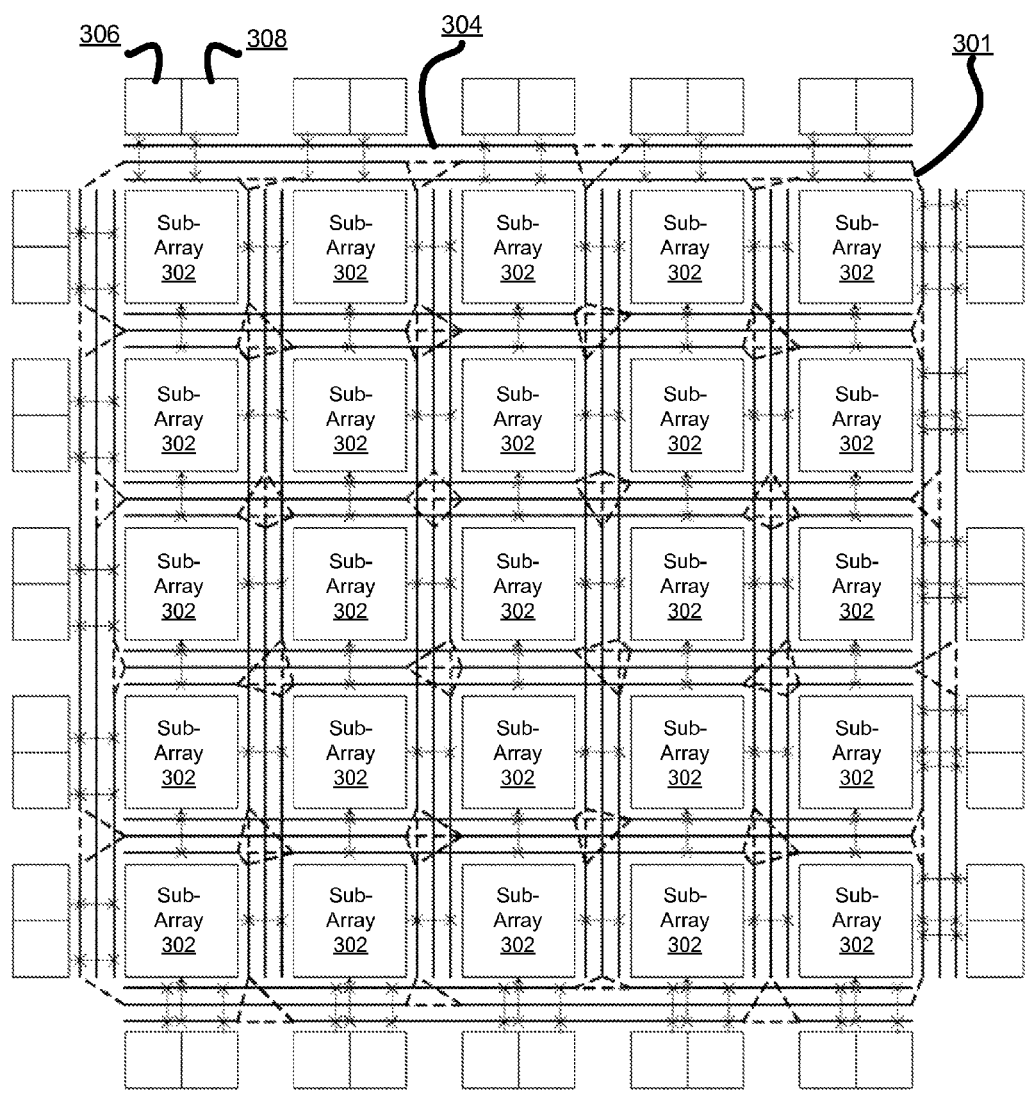
FIG. 3 is a block diagram of an example embodiment of an apparatus in accordance with the disclosed subject matter.

FIG. 3 is a block diagram of an example embodiment of an apparatus 300 in accordance with the disclosed subject matter. In various embodiments, the memory array 301 may be implemented with a bus-based interconnection and routing scheme. In the illustrated embodiment, the memory array 301 is shown as a separate die or apparatus 300. In another embodiment, the memory array 301 (with the bus-based routing scheme) may be integrated with other components on a shared die (e.g., as a system-on-a-chip, as a processor cache, etc.).

As described above, the memory array 301 may include a plurality of sub-arrays 302. In various embodiments, the sub-arrays 302 may be configured as RLUTs and/or RAMs. As described above, each sub-array 302 may include a number of input and output signals (shown in FIG. 2a, etc.). In the illustrated embodiment, the apparatus may include input signal pads 306 and output signal pads 308, for the memory array 301 as a whole.

In the illustrated embodiment, the apparatus 300 may include a communications bus 304. In various embodiments, the communications bus 304 may allow the routing scheme between the sub-arrays 302 to be dynamically altered to re-route signals between the sub-arrays 302. For example, if two sub-arrays are configured to act as 4-bit adders (shown in FIGS. 2b and 2c), the communications bus 304 may effectively route the I/O signals between the two sub-arrays 302 to act as a single 8-bit adder (shown in FIG. 2c). When the a user or processor, etc. decides that such an 8-bit adder is no longer desired, the communications bus 304 may effectively re-route the I/O signals of the two sub-arrays to dissolve the 8-bit adder. In such an embodiment, the communications bus 304 may effectively route the I/O signals to support whatever new logical function is desired (e.g., a multiplier and a dictionary, etc.). It is understood that the above is merely one illustrative example to which the disclosed subject matter is not limited.

In some embodiments, the communications bus 304 may be more efficient than a point-to-point routing scheme. For example, a bus-based routing scheme may consume less area, be faster, and consume less power than a traditional point-to-point routing scheme. However, in various embodiments, some memory arrays 301 may employ other routing schemes (e.g., point-to-point, address-based, etc.) or a combination of two or more schemes. Further, in some embodiments, the routing may be under the control or direction of a configuration interface (shown in FIG. 1).

Figure 4:
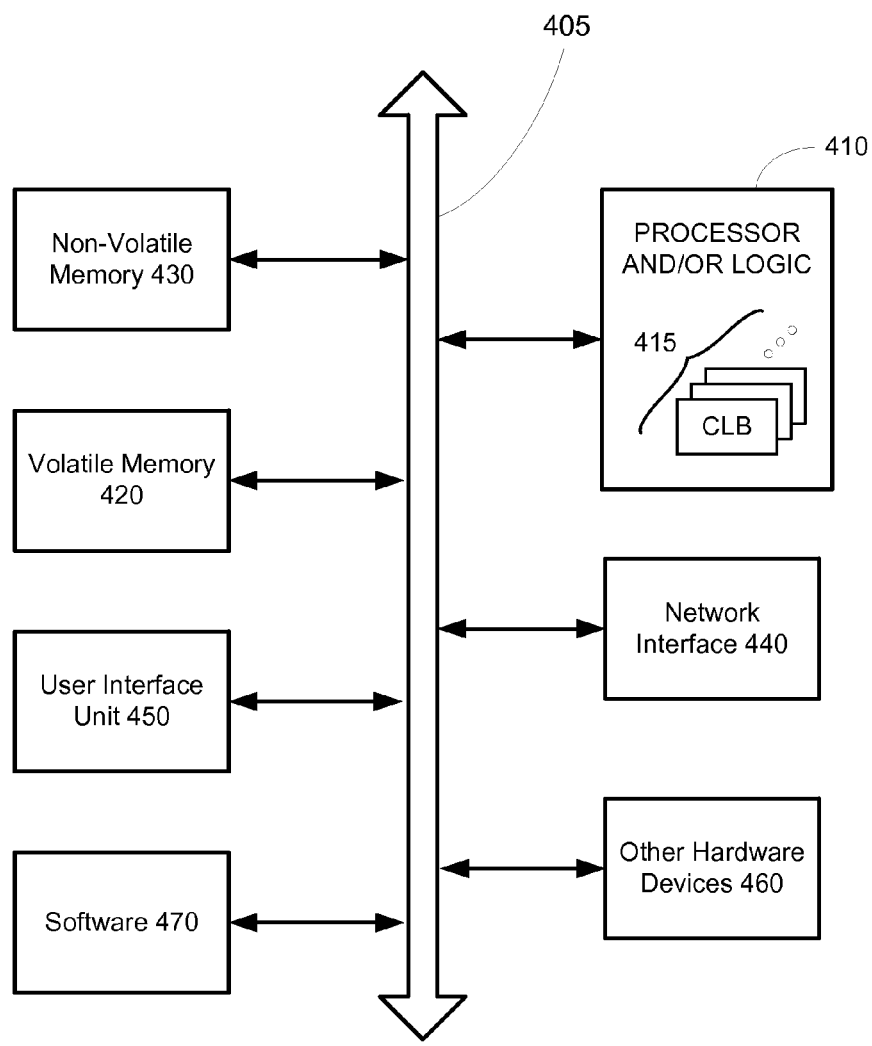
FIG. 4 is a schematic block diagram of an information processing system that may include devices formed according to principles of the disclosed subject matter.

FIG. 4 is a schematic block diagram of an information processing system 400, which may include semiconductor devices formed according to principles of the disclosed subject matter.

Referring to FIG. 4, an information processing system 400 may include one or more of devices constructed according to the principles of the disclosed subject matter. In another embodiment, the information processing system 400 may employ or execute one or more techniques according to the principles of the disclosed subject matter.

In various embodiments, the information processing system 400 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 400 may be used by a user (not shown).

The information processing system 400 according to the disclosed subject matter may further include a central processing unit (CPU), logic, or processor 410. In some embodiments, the processor 410 may include one or more functional unit blocks (FUBs) or combinational logic blocks (CLBs) 415. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 400 according to the disclosed subject matter may further include a volatile memory 420 (e.g., a Random Access Memory (RAM), etc.). The information processing system 400 according to the disclosed subject matter may further include a non-volatile memory 430 (e.g., a hard drive, an optical memory, a NAND or Flash memory, etc.). In some embodiments, either the volatile memory 420, the non-volatile memory 430, or a combination or portions thereof may be referred to as a "storage medium". In various embodiments, the volatile memory 420 and/or the non-volatile memory 430 may be configured to store data in a semi-permanent or substantially permanent form.

In various embodiments, the reconfigurable look-up tables (RLUTs) described above may be included in the volatile memory 420 or even the non-volatile memory 430. As described above, a RLUT may be included as part of a DRAM or other memory. As described above, in some embodiments, a portion of the memory 420 or 430 may be employed to store data and a second portion may be employed as a RLUT. In some embodiments, the RLUT may also be considered part of the processor and/or logic 410. As described above, the RLUT may perform one or more logic functions, and therefore may execute instructions. It is understood that the above are merely a few illustrative examples to which the disclosed subject matter is not limited.

In various embodiments, the information processing system 400 may include one or more network interfaces 440 configured to allow the information processing system 400 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 400 according to the disclosed subject matter may further include a user interface unit 450 (e.g., a display adapter, a haptic interface, a human interface device, etc.). In various embodiments, this user interface unit 450 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 400 may include one or more other devices or hardware components 460 (e.g., a display or monitor, a keyboard, a mouse, a camera, a fingerprint reader, a video processor, etc.). It is understood that the above are merely a few illustrative examples to which the disclosed subject matter is not limited.

The information processing system 400 according to the disclosed subject matter may further include one or more system buses 405. In such an embodiment, the system bus 405 may be configured to communicatively couple the processor 410, the volatile memory 420, the non-volatile memory 430, the network interface 440, the user interface unit 450, and one or more hardware components 460. Data processed by the processor 410 or data inputted from outside of the non-volatile memory 430 may be stored in either the non-volatile memory 430 or the volatile memory 420.

In various embodiments, the information processing system 400 may include or execute one or more software components 470. In some embodiments, the software components 470 may include an operating system (OS) and/or an application. In some embodiments, the OS may be configured to provide one or more services to an application and manage or act as an intermediary between the application and the various hardware components (e.g., the processor 410, a network interface 440, etc.) of the information processing system 400. In such an embodiment, the information processing system 400 may include one or more native applications, which may be installed locally (e.g., within the non-volatile memory 430, etc.) and configured to be executed directly by the processor 410 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 410.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a memory array comprising a plurality of memory sub-arrays;
   wherein at least one of the sub-arrays is arranged as a reconfigurable look-up table, wherein the reconfigurable look-up table is configured to dynamically switch between a data storage mode and a look-up table mode, and wherein regardless of mode a same set of communication signals is employed to write to the reconfigurable look-up table; and
   wherein the reconfigurable look-up table comprises:
   a plurality of memory cells configured to store data,
   a local row decoder configured to, when in the look-up table mode, activate one or more rows of memory cells based upon a set of input signals, and
   a local line selector configured to, when in the look-up table mode, based upon at least one input signal, select a sub-set of values stored in the activated one or more rows of memory cells and output the selected values as the output of the reconfigurable look-up table, wherein the values, as output, are the same as the values, as stored.

2. The apparatus of claim 1, wherein the at least one input signal is divided into groups such that each group is associated with an operand of a logic function.

3. The apparatus of claim 1, wherein the memory array comprises:
   an input/output (I/O) interface configured to facilitate read access and write access to the memory array; and
   a configuration interface configured to adjust a routing of signals within the reconfigurable look-up table.

4. The apparatus of claim 3, wherein memory array includes a plurality of reconfigurable look-up tables; and
   wherein the configuration interface is configured to adjust a routing of signals between the reconfigurable look-up tables.

5. The apparatus of claim 1, wherein the reconfigurable look-up table includes a minimum plurality of input signals, and a minimum plurality of output signals; and
   wherein the reconfigured look-up table is configured to be dynamically altered such that a number of active input signals and a number of active output signals is altered.

6. The apparatus of claim 1, wherein the reconfigurable look-up table is configured to perform an arithmetic computing function.

7. The apparatus of claim 1, wherein reconfigurable look-up table includes registers to store output signals of the reconfigurable look-up table.

8. The apparatus if claim 1, wherein the memory array comprises two or more reconfigurable look-up tables; and
   wherein the two or more reconfigurable look-up tables are routed such that the two or more reconfigurable look-up tables function in concert to perform a single arithmetic computing function.

9. The apparatus of claim 1, wherein the memory array comprises two or more reconfigurable look-up tables;
   wherein the two or more reconfigurable look-up tables are electrically coupled via a bus-based routing scheme; and
   wherein the bus-based routing scheme is configured to be dynamically altered to re-route signals between the two or more reconfigurable look-up tables.

10. The apparatus of claim 1, wherein the memory array comprises:
    a plurality of processing elements, wherein the plurality of processing elements includes the reconfigurable look-up table; and
    at least one random access memory sub-array configured to store data for the plurality of processing elements.

11. The apparatus of claim 1, wherein the reconfigurable look-up table comprises dynamic random-access memory (DRAM) cells configured to store the data of the reconfigurable look-up table.

12. The apparatus of claim 1, wherein the data of the reconfigurable look up table is configured to be dynamically altered via a write operation to the memory array.

13. An apparatus comprising:
    a processor comprising fixed logical circuit configured to execute logical functions; and wherein the processor is configured to:
    store data in a memory cell of a dynamic random access memory array,
    store a look-up table configured to perform a logical function in a reconfigurable look-up table of the dynamic random access memory array, wherein a same set of communication signals is employed to write to the reconfigurable look-up table and the memory cell, and
    offload an execution of a logical function to a reconfigurable look-up table included by a dynamic random access memory array,
    wherein the results of the execution of the logical function includes a portion of the values that were stored in the reconfigurable look-up table, wherein the values of the results are the same as the values that were stored.

14. The apparatus of claim 13, wherein the processor is configured to offload the execution of the logical function by performing a write access to the reconfigurable look-up table, wherein the write access includes input operands associated with the logical function associated with the reconfigurable look-up table.

15. The apparatus of claim 13, wherein the processor is configured to retrieve the results of the execution of the logical function by performing a read access to the reconfigurable look-up table, wherein the read access returns the output values associated with the logical function associated with the reconfigurable look-up table.

16. The apparatus of claim 13, wherein the processor is configured to store a logical function in the reconfigurable look-up table that includes a minimum plurality of input signals, and a minimum plurality of output signals.

17. The apparatus of claim 13, wherein the processor is configured to store two or more reconfigurable look-up tables in the dynamic random access memory array; and wherein the two or more reconfigurable look-up tables are routed such that the two or more reconfigurable look-up tables function in concert to perform a single logic function.

18. The apparatus of claim 13, wherein the dynamic random access memory array includes a plurality of sub-arrays of memory cells; and the processor is configured to dynamically arrange a sub-array as either a reconfigurable memory look-up table or a storage memory.

19. The apparatus of claim 13, wherein the processor is configured to store the look-up table by performing a write access to the reconfigurable look-up table, wherein the write access includes a setting indicating a number of input signals associated with the logical function and a setting indicating a number of output signals associated with the logical function.

* * * * *